(12) United States Patent
Inaba et al.

(10) Patent No.: US 11,065,639 B2
(45) Date of Patent: Jul. 20, 2021

(54) COATING TREATMENT METHOD, COMPUTER STORAGE MEDIUM AND COATING TREATMENT APPARATUS

(71) Applicant: Tokyo Electron Limited, Tokyo (JP)

(72) Inventors: Shogo Inaba, Koshi (JP); Kosuke Yoshihara, Koshi (JP); Shinichi Hatakeyama, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 52 days.

(21) Appl. No.: 16/468,356

(22) PCT Filed: Nov. 24, 2017

(86) PCT No.: PCT/JP2017/042266
§ 371 (c)(1),
(2) Date: Jun. 11, 2019

(87) PCT Pub. No.: WO2018/116745
PCT Pub. Date: Jun. 28, 2018

(65) Prior Publication Data
US 2020/0147637 A1 May 14, 2020

(30) Foreign Application Priority Data
Dec. 22, 2016 (JP) .............................. JP2016-249872

(51) Int. Cl.
*B05C 11/08* (2006.01)
*B05C 5/02* (2006.01)
(Continued)

(52) U.S. Cl.
CPC ............... *B05C 11/08* (2013.01); *B05C 5/02* (2013.01); *B05D 1/005* (2013.01); *B05D 1/36* (2013.01); *B05D 3/12* (2013.01); *H01L 21/027* (2013.01)

(58) Field of Classification Search
CPC .. B05D 1/005; B05D 1/36; B05D 3/12; B05C 11/08; B05C 5/02; H01L 21/027
(Continued)

(56) References Cited

U.S. PATENT DOCUMENTS 9,349,622 B2* 5/2016 Wang ...................... B05B 12/02
2001/0033895 A1* 10/2001 Minami .................. G03F 7/162
427/240

(Continued)

FOREIGN PATENT DOCUMENTS

JP   H06-210230 A   8/1994
JP   2008-307488 A   12/2008

OTHER PUBLICATIONS

International Search Report dated Feb. 20, 2018 issued in corresponding international patent application No. PCT/JP2017/042266 (and English translation thereof).

*Primary Examiner* — Kelly M Gambetta
(74) *Attorney, Agent, or Firm* — Posz Law Group, PLC

(57) ABSTRACT

A method for coating a top of a substrate with a coating solution includes supplying, before a solution film of the coating solution formed on the substrate dries, a solvent for the coating solution to a peripheral portion on the solution film of the coating solution on the substrate while rotating the substrate at a predetermined rotation speed to form a mixed layer of the coating solution and the solvent at the peripheral portion. The method includes, then, controlling a film thickness of the coating solution after drying by rotating the substrate at a rotation speed higher than the predetermined rotation speed to push the mixed layer to an outer peripheral side.

9 Claims, 10 Drawing Sheets

(51) Int. Cl.
  *B05D 1/36* (2006.01)
  *B05D 3/12* (2006.01)
  *B05D 1/00* (2006.01)
  *H01L 21/027* (2006.01)
(58) Field of Classification Search
  USPC .......................................................... 427/240
  See application file for complete search history.

(56) References Cited

U.S. PATENT DOCUMENTS

| | | | | |
|---|---|---|---|---|
| 2002/0176936 | A1* | 11/2002 | Matsuyama | B05C 11/08 427/240 |
| 2004/0265493 | A1* | 12/2004 | Mizuno | H01L 21/6715 427/335 |
| 2008/0057194 | A1* | 3/2008 | Tanaka | G03F 7/162 427/240 |
| 2016/0167079 | A1* | 6/2016 | Hasimoto | H01L 21/6715 700/283 |
| 2018/0021804 | A1* | 1/2018 | Hashimoto | H01L 21/6715 427/425 |

* cited by examiner

COATING TREATMENT METHOD, COMPUTER STORAGE MEDIUM AND COATING TREATMENT APPARATUS

TECHNICAL FIELD

Cross-Reference to Related Applications

This application is based upon and claims the benefit of priority of the prior Japanese Patent Application No. 2016-249872, filed in Japan on Dec. 22, 2016, the entire contents of which are incorporated herein by reference.

The present invention relates to a coating treatment method, a computer storage medium and a coating treatment apparatus, for coating a substrate with a coating solution.

BACKGROUND ART

For example, in a photolithography process in a manufacturing process of a semiconductor device, a coating treatment of coating, for example, a top of a semiconductor wafer (hereinafter, referred to as a "wafer") as a substrate with a predetermined coating solution to form a coating film such as an anti-reflection film or a resist film, exposure processing of exposing the resist film to a predetermined pattern, and a developing treatment of developing the exposed resist film, are sequentially performed to form a predetermined resist pattern on the wafer.

In the above-described coating treatment, a so-called spin-coating method is widely used which forms a coating film on the wafer by supplying the coating solution from a nozzle onto a central portion of the rotated wafer and diffusing the coating solution on the wafer by the centrifugal force. In such a coating treatment, a so-called pre-wet treatment of coating a top of the wafer with a solvent such as a thinner before supplying the coating solution to improve the wettability of the wafer is often performed for the in-plane uniformity of the coating film and the reduction of the amount of the coating solution used. The coating with the solvent in such a pre-wet treatment is also performed by supplying the solvent to the central portion of the wafer and rotating the wafer to diffuse the solvent over the wafer, but the coating solution sometimes does not diffuse to the end of the substrate because the solvent supplied for pre-wet dries due to the rotation of the wafer, in which case, coating unevenness occurs.

Therefore, in recent years, in order to prevent the coating solution from being not spread to the end of the substrate due to the dry of the solvent supplied for pre-wet on the surface of the substrate by the rotation of the substrate, it is proposed to further supply the solvent to the peripheral portion on the surface of the substrate where the coating solution has not been diffused to thereby improve the flowability of the coating solution at the peripheral portion of the substrate so as to smoothly spread the coating solution to the end of the substrate (Patent Document 1).

PRIOR ART DOCUMENT

Patent Document

[Patent Document 1] Japanese Laid-open Patent Publication No. 2008-307488

DISCLOSURE OF THE INVENTION

Problems to be Solved by the Invention

However, the above-described prior art is useful in the case of coating with a so-called low-viscous resist, but there is room for improvement in terms of improvement in uniformity of the film thickness in the case of further coating the surface of a wafer (so-called stepped substrate), on which patterns have already been formed, with a resist, or in the case of coating with a middle-viscous resist solution. Particularly at the peripheral portion of the wafer, in the case of coating with the middle-viscous resist solution, the film thickness is generally likely to increase, which is desired to be corrected or controlled.

The present invention has been made in consideration of the above points, and its object is to uniformly coat with a coating solution within a substrate in coating a top of a substrate such as a wafer with a coating solution even when the substrate is a stepped substrate or the coating solution has a middle viscosity.

Means for Solving the Problems

An aspect of the present invention is a method for coating a top of a substrate with a coating solution, the method including: supplying, before a solution film of the coating solution formed on the substrate dries, a solvent for the coating solution to a peripheral portion on the solution film of the coating solution on the substrate while rotating the substrate at a predetermined rotation speed to form a mixed layer of the coating solution and the solvent at the peripheral portion; and then, controlling a film thickness of the coating solution after drying by rotating the substrate at a rotation speed higher than the predetermined rotation speed to push the mixed layer to an outer peripheral side.

According to an aspect of the present invention, before the solution film of the coating solution formed on the substrate dries, the solvent for the coating solution is supplied to the peripheral portion on the solution film on the substrate while rotating the substrate at the predetermined rotation speed to form the mixed layer of the coating solution and the solvent at the peripheral portion, so that the component of the coating solution elutes into the mixed layer, and then the substrate is rotated at the rotation speed higher than the predetermined rotation speed to push the mixed layer to the outer peripheral side, so that the film thickness on the outsider side than the mixed layer can be reduced and the film thickness as a whole can be made uniform.

An aspect of the present invention according to another viewpoint is a method for coating a top of a substrate with a coating solution, the method including: a solvent solution film formation step of supplying a solvent for the coating solution onto the substrate to form a solution film of the solvent on an entire surface of the substrate; a coating solution supply step of then supplying the coating solution to a central portion of the substrate while rotating the substrate at a first rotation speed; a coating solution diffusion step of then diffusing the coating solution over the entire surface of the substrate by rotating the substrate at a second rotation speed higher than the first rotation speed; a peripheral portion solvent supply step of then supplying the solvent for the coating solution to a peripheral portion on a solution film of the coating solution on the substrate while rotating the substrate at a third rotation speed lower than the second rotation speed; and a peripheral portion film thickness adjustment step of then rotating the substrate at a fourth rotation speed higher than the third rotation speed.

According to an aspect of the present invention of the viewpoint, it is possible to form the mixed layer at the peripheral portion solvent supply step, and adjust the film thickness at the peripheral portion by the peripheral portion film thickness adjustment step thereafter to improve the in-plane uniformity of the substrate.

It is suitable for the present invention that a viscosity of the coating solution is 20 to 500 cP that is a so-called middle viscosity. Note that the present invention is suitable for the coating treatment in which the film thickness of the coating solution of the substrate is a film thickness of about 1 μm to 15 μm after dry.

It is adoptable to use a supply member which supplies the solvent at the peripheral portion solvent supply step having a supply port having a predetermined length in a radial direction of the substrate or a plurality of supply ports in the radial direction of the substrate. In this case, as the shape of the supply port, an arbitrary one, for example, a circular shape or a slit shape can be employed.

An aspect of the present invention according to still another viewpoint is a computer-readable storage medium storing a program running on a computer of a control unit controlling a coating treatment apparatus to cause the coating treatment apparatus to execute the above-described coating treatment method.

An aspect of the present invention according to yet another viewpoint is a coating treatment apparatus for coating a top of a substrate with a coating solution, the coating treatment apparatus including: a substrate holding unit which holds and rotates the substrate; a coating solution supply nozzle which supplies the coating solution onto the substrate; a solvent supply nozzle which supplies a solvent for the coating solution onto the substrate; a first moving mechanism which moves the coating solution supply nozzle; a second moving mechanism which moves the solvent supply nozzle; and a control unit which controls the substrate holding unit, the coating solution supply nozzle, the solvent supply nozzle, the second moving mechanism, and the first moving mechanism. The control unit is configured to supply the solvent for the coating solution by the solvent supply nozzle to a central portion of the substrate to form a solution film of the solvent on an entire surface of the substrate, then supply the coating solution by the coating solution supply nozzle to the central portion of the substrate while rotating the substrate at a first rotation speed, then diffuse the coating solution over the entire surface of the substrate by rotating the substrate at a second rotation speed higher than the first rotation speed, then supply the solvent for the coating solution by the solvent supply nozzle to a peripheral portion on a solution film of the coating solution on the substrate while rotating the substrate at a third rotation speed lower than the second rotation speed, and then rotate the substrate at a fourth rotation speed higher than the third rotation speed.

In supplying the solvent to the peripheral portion on the solution film of the coating solution, another peripheral portion solvent supply nozzle may be used in place of the solvent supply nozzle, and the control unit may also control the another peripheral portion solvent supply nozzle.

In this case, it is adoptable to employ the another solvent supply nozzle having a supply port having a predetermined length in a radial direction of the substrate or a plurality of supply ports in the radial direction of the substrate. For example, another solvent supply nozzle having a shape of the supply port, for example, a circular shape or a slit shape can also be used.

Effect of the Invention

According to the present invention, in forming a solution film of a coating solution on a substrate by coating a top of the substrate with the coating solution, the uniformity of the film thickness of the coating solution within the substrate can be further improved than before.

BEST MODE FOR CARRYING OUT THE INVENTION

Figure 1:
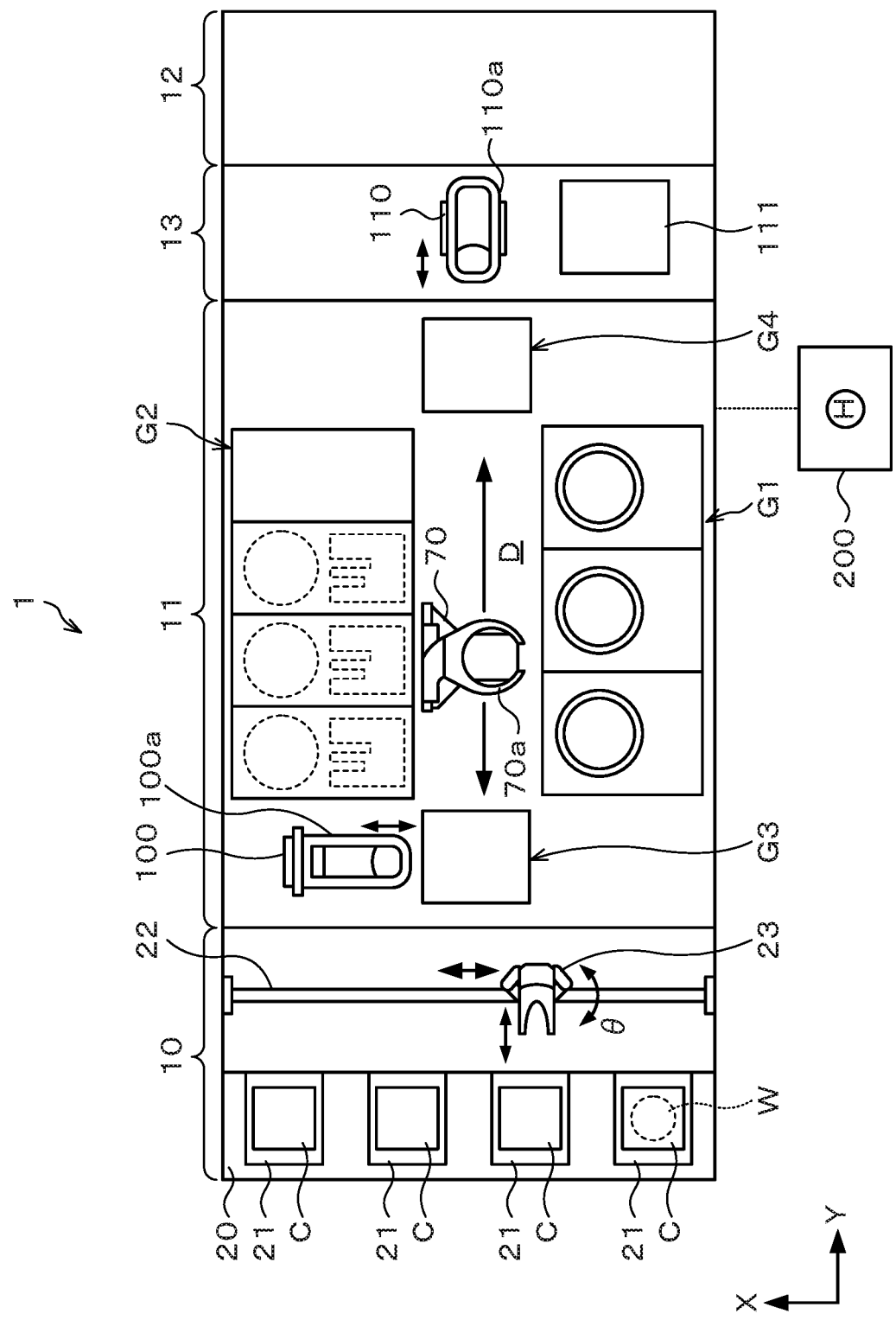
FIG. 1 A plan view illustrating the outline of a configuration of a substrate treatment system according to an embodiment.
Figure 2:
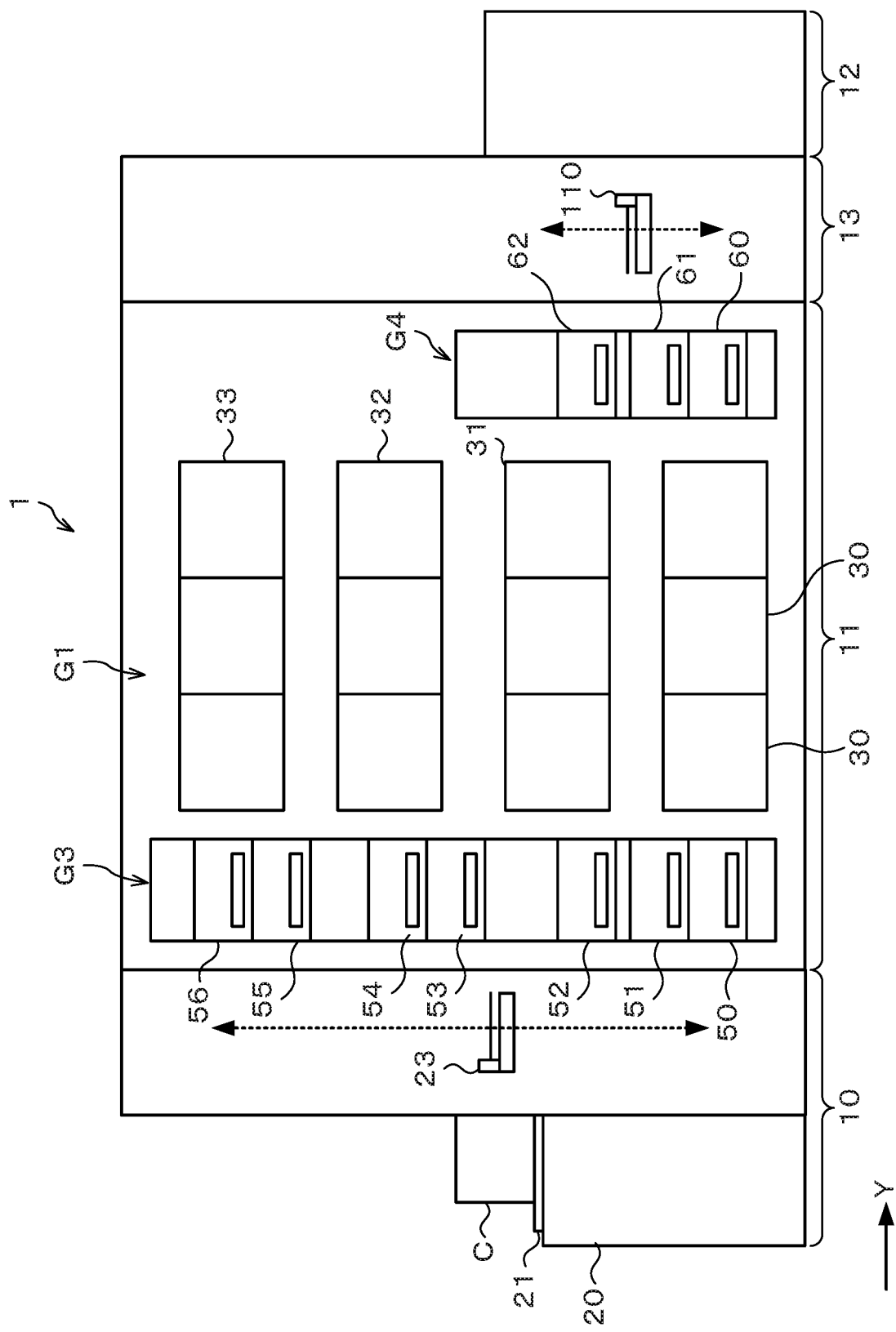
FIG. 2 A front view illustrating the outline of the configuration of the substrate treatment system according to the embodiment.
Figure 3:
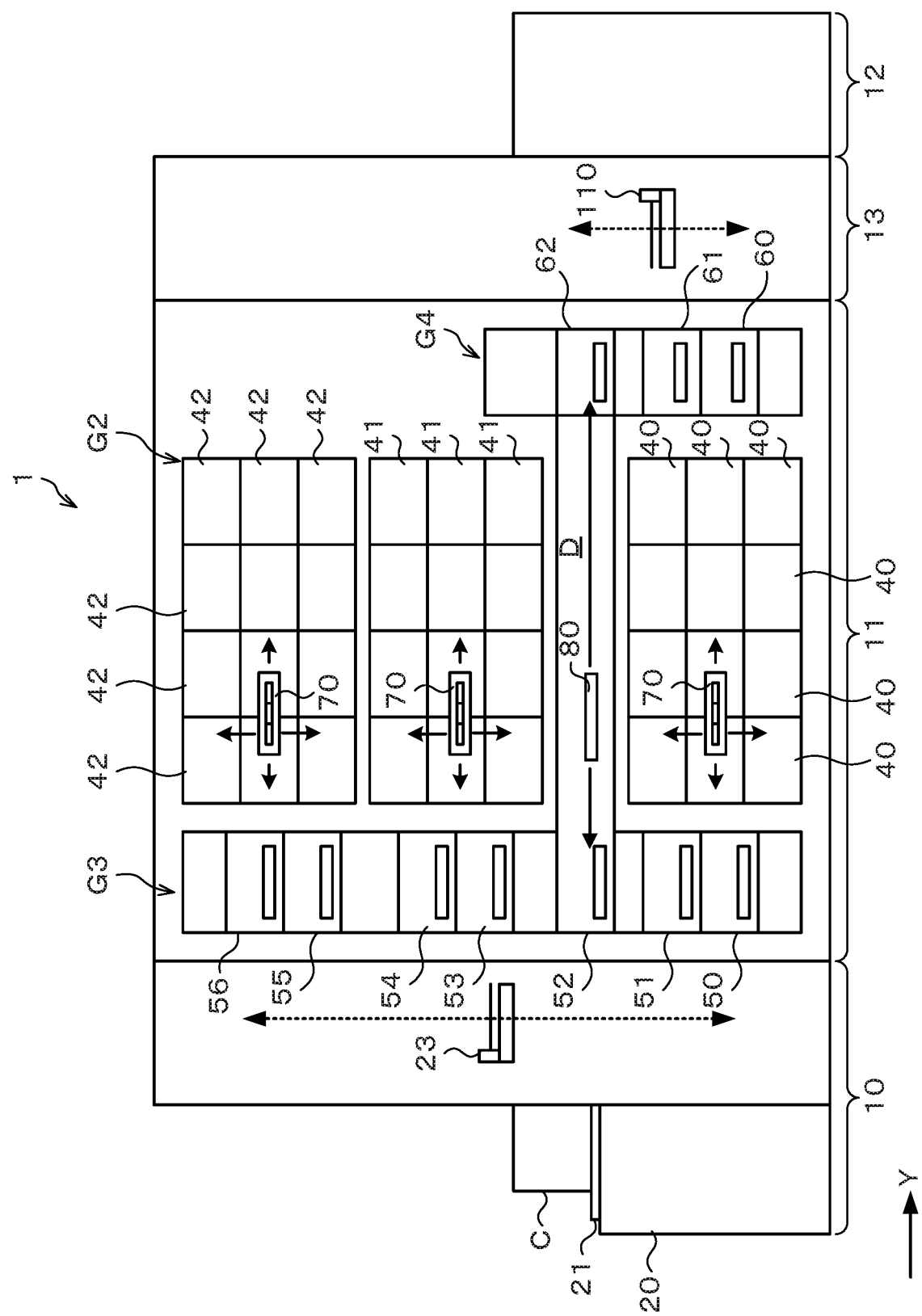
FIG. 3 A rear view illustrating the outline of the configuration of the substrate treatment system according to the embodiment.

Hereinafter, an embodiment of the present invention will be explained. FIG. 1 is an explanatory view illustrating the outline of a configuration of a substrate treatment system 1 including a coating treatment apparatus performing a coating treatment method according to this embodiment. FIG. 2 and FIG. 3 are a front view and a rear view schematically illustrating the outline of an internal configuration of the substrate treatment system 1, respectively. Note that a case where a coating solution is a resist solution and the coating treatment apparatus is a resist coating apparatus which coats a substrate with the resist solution will be explained as an example in this embodiment.

The substrate treatment system 1 has, as illustrated in FIG. 1, a configuration in which a cassette station 10 into/out of which a cassette C housing a plurality of wafers W is transferred, a treatment station 11 including a plurality of various treatment apparatuses which perform predetermined treatments on the wafer W, and an interface station 13 which delivers the wafer W to/from an exposure apparatus 12 adjacent to the treatment station 11, are integrally connected.

In the cassette station 10, a cassette mounting table 20 is provided. The cassette mounting table 20 is provided with a plurality of cassette mounting plates 21 on which the cassettes C are mounted when the cassettes C are transferred in/out from/to the outside of the substrate treatment system 1.

In the cassette station 10, a wafer transfer apparatus 23 is provided which is movable on a transfer path 22 extending in an X-direction as illustrated in FIG. 1. The wafer transfer apparatus 23 is movable also in a vertical direction and around a vertical axis (in a θ-direction), and can transfer the wafer W between the cassette C on each of the cassette mounting plates 21 and a delivery apparatus in a later-described third block G3 in the treatment station 11.

In the treatment station 11, a plurality of, for example, four blocks, such as first to fourth blocks G1, G2, G3, G4 each including various apparatuses are provided. For example, the first block G1 is provided on the front side (X-direction negative direction side in FIG. 1) in the treatment station 11, and the second block G2 is provided on the rear side (X-direction positive direction side in FIG. 1) in the treatment station 11. Further, the third block G3 is provided on the cassette station 10 side (Y-direction negative direction side in FIG. 1) in the treatment station 11, and the fourth block G4 is provided on the interface station 13 side (Y-direction positive direction side in FIG. 1) in the treatment station 11.

For example, in the first block G1, as illustrated in FIG. 2, a plurality of solution treatment apparatuses, for example, developing treatment apparatuses 30 each of which performs a developing treatment on the wafer W, lower anti-reflection film forming apparatuses 31 each of which forms an anti-reflection film (hereinafter, referred to as a "lower anti-reflection film") at a lower layer of a resist film of the wafer W, resist coating apparatuses 32 each of which coats the wafer W with a resist solution to form a resist film, and upper anti-reflection film forming apparatuses 33 each of which forms an anti-reflection film (hereinafter, referred to as an "upper anti-reflection film") at an upper layer of the resist film of the wafer W, are arranged in this order from the bottom.

For example, three pieces of each of the developing treatment apparatus 30, the lower anti-reflection film forming apparatus 31, the resist coating apparatus 32, and the upper anti-reflection film forming apparatus 33 are arranged side by side in the horizontal direction. Note that the numbers and the arrangement of the developing treatment apparatuses 30, the lower anti-reflection film forming apparatuses 31, the resist coating apparatuses 32, and the upper anti-reflection film forming apparatuses 33 can be arbitrarily selected.

In the developing treatment apparatus 30, the lower anti-reflection film forming apparatus 31, the resist coating apparatus 32, and the upper anti-reflection film forming apparatus 33, for example, spin coating of coating the top of the wafer W with a predetermined coating solution is performed. In the spin coating, the coating solution is discharged, for example, from a coating nozzle onto the wafer W and the wafer W is rotated to diffuse the coating solution over the surface of the wafer W. Note that the configuration of the resist coating apparatus 32 will be described later.

For example, in the second block G2, as illustrated in FIG. 3, thermal treatment apparatuses 40 each of which performs thermal treatments such as heating and cooling on the wafer W, adhesion apparatuses 41 each for enhancing adhesion between the resist solution and the wafer W, and edge exposure apparatuses 42 each of which exposes the outer peripheral portion of the wafer W are provided side by side in the vertical direction and in the horizontal direction. The numbers and the arrangement of the thermal treatment apparatuses 40, the adhesion apparatuses 41, and the edge exposure apparatuses 42 can also be arbitrarily selected.

For example, in the third block G3, a plurality of delivery apparatuses 50, 51, 52, 53, 54, 55, 56 are provided in order from the bottom. Further, in the fourth block G4, a plurality of delivery apparatuses 60, 61, 62 are provided in order from the bottom.

A wafer transfer region D is formed in a region surrounded by the first block G1 to the fourth block G4 as illustrated in FIG. 1. In the wafer transfer region D, for example, a plurality of wafer transfer apparatuses 70 are arranged each of which has a transfer arm 70a movable, for example, in the Y-direction, the X-direction, the θ-direction, and the vertical direction. The wafer transfer apparatus 70 can move in the wafer transfer region D to transfer the wafer W to a predetermined apparatus in the first block G1, the second block G2, the third block G3, and the fourth block G4 located therearound.

Further, in the wafer transfer region D, a shuttle transfer apparatus 80 is provided which linearly transfers the wafer W between the third block G3 and the fourth block G4.

The shuttle transfer apparatus 80 is configured to be linearly movable, for example, in the Y-direction in FIG. 3. The shuttle transfer apparatus 80 can move in the Y-direction while supporting the wafer W, and transfer the wafer W between the delivery apparatus 52 in the third block G3 and the delivery apparatus 62 in the fourth block G4.

As illustrated in FIG. 1, a wafer transfer apparatus 100 is provided adjacent on the X-direction positive direction side of the third block G3. The wafer transfer apparatus 100 has a transfer aim 100a movable, for example, in the X-direction, the θ-direction, and the vertical direction. The wafer transfer apparatus 100 can move up and down while supporting the wafer W by the transfer arm 100a to transfer the wafer W to each of the delivery apparatuses in the third block G3.

In the interface station 13, a wafer transfer apparatus 110 and a delivery apparatus 111 are provided. The wafer transfer apparatus 110 has a transfer arm 110a movable, for example, in the Y-direction, the θ-direction, and the vertical direction. The wafer transfer apparatus 110 can transfer the wafer W between each of the delivery apparatuses in the fourth block G4, the delivery apparatus 111 and the exposure apparatus 12, for example, while supporting the wafer W by the transfer arm 110a.

Figure 4:
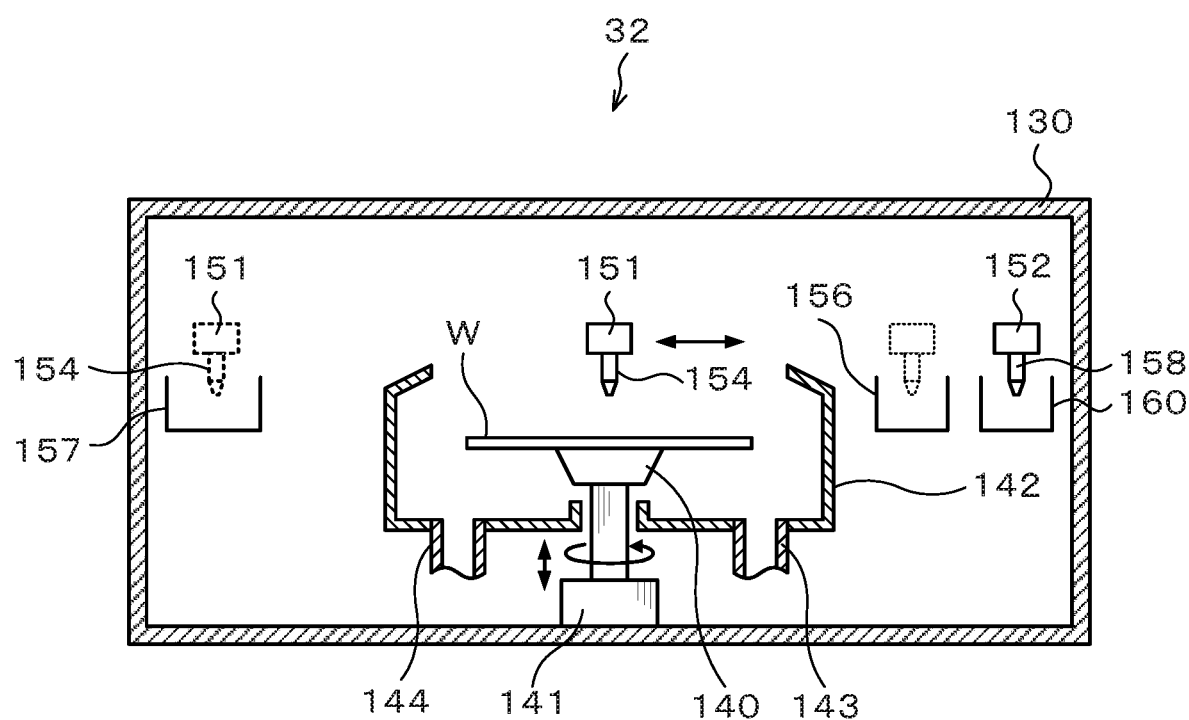
FIG. 4 A longitudinal sectional view illustrating the outline of a configuration of a resist treatment apparatus.

Next, the configuration of the aforementioned resist coating apparatus 32 will be explained. The resist coating apparatus 32 has a treatment container 130 whose inside is sealable as illustrated in FIG. 4. A side surface of the treatment container 130 is formed with a transfer-in/out port (not illustrated) for the wafer W.

In the treatment container 130, a spin chuck 140 as a substrate holding unit which holds and rotates the wafer W is provided. The spin chuck 140 can rotate at a predetermined speed by a chuck drive unit 141 such as a motor. Further, the chuck drive unit 141 is provided with a raising and lowering drive mechanism such as a cylinder, so that the spin chuck 140 can freely rise and lower.

Around the spin chuck 140, a cup 142 is provided which receives and collects liquid splashing or dropping from the wafer W. A drain pipe 143 which drains the collected liquid and an exhaust pipe 144 which exhausts the atmosphere in the cup 142 are connected to the lower surface of the cup 142.

Figure 5:
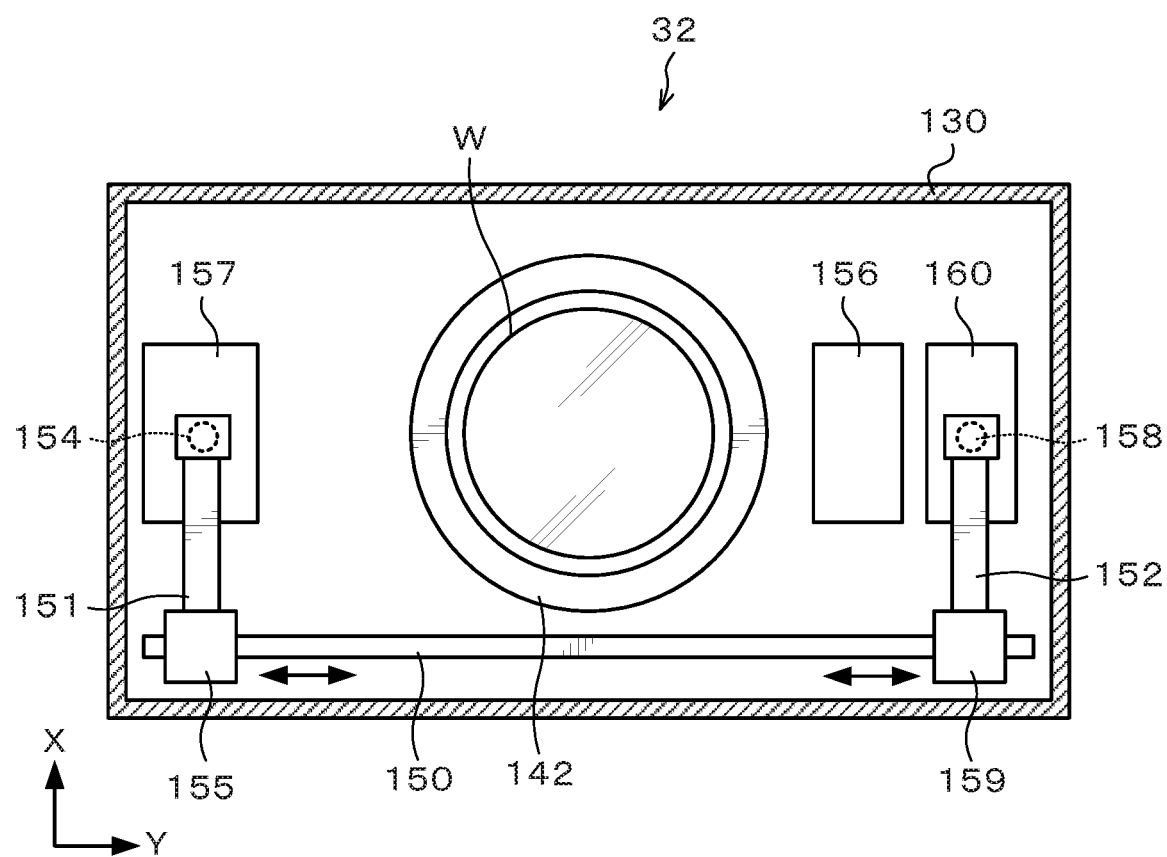
FIG. 5 A transverse sectional view illustrating the outline of the configuration of the resist treatment apparatus.

As illustrated in FIG. 5, on an X-direction negative direction (lower direction in FIG. 5) side of the cup 142, a rail 150 is formed which extends along a Y-direction (right-left direction in FIG. 5). The rail 150 is formed, for example, from a Y-direction negative direction (left direction in FIG. 5) side outer position to a Y-direction positive direction (right direction in FIG. 5) side outer position of the cup 142. At the rail 150, two arms 151, 152 are provided.

On the first arm 151, a resist solution supply nozzle 154 as a coating solution supply member is supported which supplies the resist solution as the coating solution. The first arm 151 is movable on the rail 150 by a nozzle drive unit 155 as a first moving mechanism. Thus, the resist solution supply nozzle 154 can move from a waiting section 156 provided at a Y-direction positive direction side outer position of the cup 142 through above a central portion of the wafer W in the cup 142 to a waiting section 157 provided at a Y-direction negative direction side outer position of the cup 142. Further, the first arm 151 can freely rise and lower by the nozzle drive unit 155 and thereby adjust the height of the resist solution supply nozzle 154.

On the second arm 152, a solvent supply nozzle 158 is supported which supplies a solvent for the resist solution. The second arm 152 is movable on the rail 150 by a nozzle drive unit 159 as a second moving mechanism. Thus, the solvent supply nozzle 158 can move from a waiting section 160 provided at a Y-direction positive direction side outer position of the cup 142 to above a central portion of the wafer W in the cup 142. The waiting section 160 is provided at a Y-direction positive direction side of the waiting section 156. Further, the second arm 152 can freely rise and lower by the nozzle drive unit 159 and thereby adjust the height of the solvent supply nozzle 158.

The configurations of the developing treatment apparatus 30, the lower anti-reflection film forming apparatus 31, and the upper anti-reflection film forming apparatus 33 which are the other solution treatment apparatuses are the same as the above-described configuration of the resist coating apparatus 32 except that the shape and number of the nozzles and the solutions to be supplied from the nozzles are different, and therefore the explanation thereof will be omitted.

In the above substrate treatment system 1, a control unit 200 is provided as illustrated in FIG. 1. The control unit 200 is, for example, a computer and has a program storage unit (not illustrated). In the program storage unit, a program for controlling the treatments on the wafer W in the substrate treatment system 1 is stored. Further, the program storage unit also stores programs for controlling the operations of the above-described various treatment apparatuses and a driving system such as the transfer apparatuses to realize a later-described substrate treatment in the substrate treatment system 1. Note that the above programs may be the ones which are recorded, for example, on a computer-readable storage medium H such as a computer-readable hard disk (HD), flexible disk (FD), compact disk (CD), magneto-optical disk (MO), or memory card, and installed from the storage medium into the control unit 200.

Next, a wafer treatment performed using the substrate treatment system 1 configured as described above will be explained. First, the cassette C housing a plurality of wafers W is transferred into the cassette station 10 of the substrate treatment system 1 and each of the wafers W in the cassette C is successively transferred by the wafer transfer apparatus 23 to the delivery apparatus 53 in the treatment station 11.

Then, the wafer W is transferred to the thermal treatment apparatus 40 in the second block G2 and subjected to a temperature regulation treatment. The wafer W is thereafter transferred by the wafer transfer apparatus 70, for example, to the lower anti-reflection film forming apparatus 31 in the first block G1, in which a lower anti-reflection film is formed on the wafer W. The wafer W is then transferred to the thermal treatment apparatus 40 in the second block G2 and subjected to a heat treatment and temperature regulation.

Next, the wafer W is transferred to the adhesion apparatus 41 and subjected to an adhesion treatment. Thereafter, the wafer W is transferred to the resist coating apparatus 32 in the first block G1, in which a resist film is formed on the wafer W.

Figure 6:
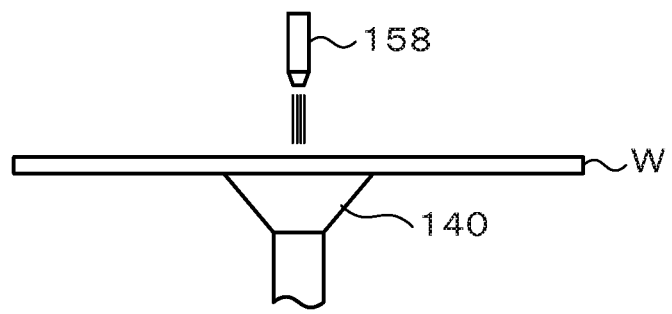
FIG. 6 A side view illustrating an appearance of supplying a solvent for a resist solution to a central portion of a wafer.
Figure 7:
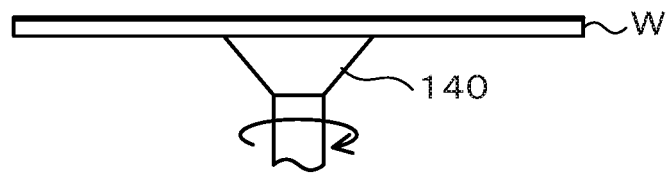
FIG. 7 A side view illustrating an appearance of performing a pre-wet treatment of diffusing the solvent to the entire surface of the wafer by rotating the wafer after the treatment in FIG. 6.

Here, a resist coating treatment in the resist coating apparatus 32 will be described in detail. For the coating treatment with the resist, first, the wafer W is suction-held on the upper surface of the spin chuck 140. Then, as illustrated in FIG. 6, the solvent supply nozzle 158 is moved to above the central portion of the wafer W and discharges the solvent for the resist solution to the central portion of the wafer W. Then, as illustrated in FIG. 7, the wafer W is rotated, for example, at 2000 rpm, whereby the solvent on the wafer W is diffused over the entire wafer surface by the spin coating method to perform a so-called pre-wet treatment.

Figure 8:
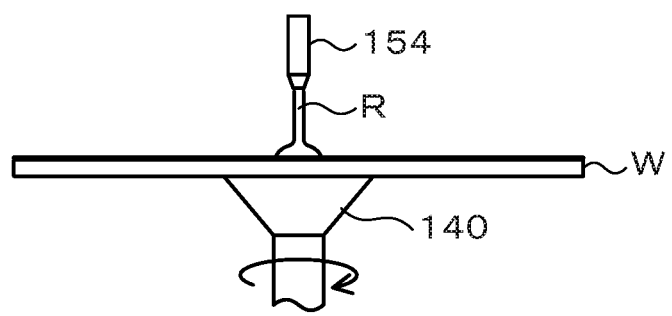
FIG. 8 A side view illustrating an appearance of supplying the resist solution to the central portion of the wafer while rotating the wafer after the treatment in FIG. 7.
Figure 9:
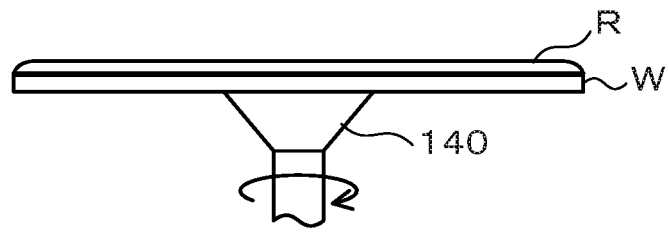
FIG. 9 A side view illustrating an appearance of diffusing the resist solution to the entire surface of the wafer by rotating the wafer after the treatment in FIG. 8.

Then, as illustrated in FIG. 8, the resist solution supply nozzle 154 is moved to above the central portion of the wafer W, and a resist solution R is supplied from the resist solution supply nozzle 154 onto the wafer W while the wafer W is being rotated at a first rotation speed, for example, 60 rpm (coating solution supply step). This forms a puddle of the resist solution R at the center of the wafer W. Then, at the time point when the supply amount of the resist solution R from the resist solution supply nozzle 154 reaches a predetermined amount, the supply of the resist solution R is stopped. Then, as illustrated in FIG. 9, the resist solution supply nozzle 154 is retracted, and the rotation speed of the wafer W is accelerated from the first rotation speed to a second rotation speed. As the second rotation speed, for example, 2500 rpm to 4000 rpm is preferable and is, for example, 3500 rpm in this embodiment. The rotation speed of the wafer W reached the second rotation speed is maintained for a predetermined time, for example, about three seconds in this embodiment. This diffuses the resist solution R supplied to the central portion of the wafer W toward the outer peripheral portion of the wafer W, whereby a film of the resist solution R is formed on the entire surface of the wafer W (coating solution diffusion step).

Figure 10:
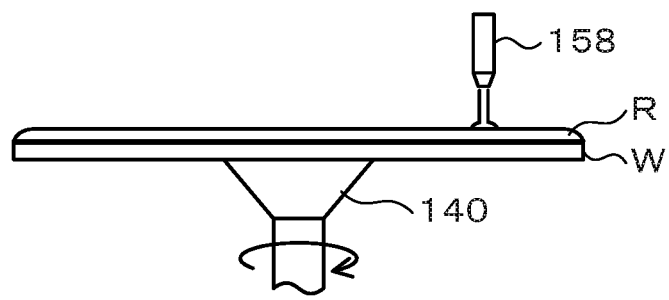
FIG. 10 A side view illustrating an appearance of supplying the solvent for the resist solution to a peripheral portion of the wafer while rotating the wafer after the treatment in FIG. 9.

Thereafter, the wafer W is kept rotated as it is to dry the film of the resist solution R in a conventional process, whereas the solvent supply nozzle 158 is moved to the peripheral portion of the wafer W as illustrated in FIG. 10 and supplies the solvent for the resist solution to the peripheral portion of the wafer W while the wafer W is being rotated in this embodiment (peripheral portion solvent supply step). The rotation speed in this case is a third rotation speed lower than the above-described second rotation speed. As the third rotation speed, for example, 1 to 100 rpm can be exemplified. This is because if the rotation speed is too high, the supplied solvent splashes or the like. In this case, it is preferable to supply the solvent only during one rotation of the wafer W. This is because the solvent is excessively supplied, the resist solution R flows out to reveal the base of the wafer W and the resist pattern at the lower layer formed with patterns. However, depending on the film thickness of the resist solution R and the supply amount of the solvent, the solvent may be supplied during a plurality of rotations of the wafer W. In short, it is only necessary to prevent the base of the wafer W and the resist film at the lower layer from being revealed.

The position of the peripheral portion to which the solvent is supplied is set in view of the profile of the film of the resist solution formed by the spin coating method of supplying the resist solution to the central portion of the wafer W after the conventional pre-wet treatment and diffusing it as described later.

Figure 11:
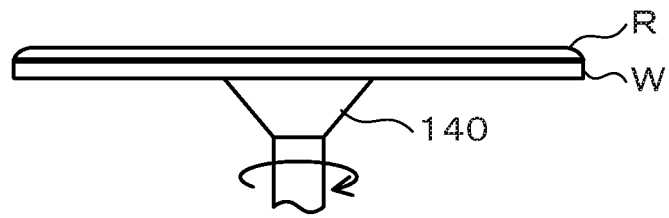
FIG. 11 A side view illustrating an appearance of adjusting the film thickness of a solution film of the resist solution by rotating the wafer after the treatment in FIG. 10.

Then, as illustrated in FIG. 11, the solvent supply nozzle 158 is retracted, and the wafer W is rotated at a fourth rotation speed higher than the above third rotation speed (peripheral portion film thickness adjustment step). This adjusts the film thickness at the peripheral portion of the wafer W. The rotation speed of the wafer W in this case is preferably, for example, about 1000 rpm to 2000 rpm, and a suitable rotation speed may be selected according to the range of the region of the peripheral portion and the range of the adjustment of the film thickness.

Figure 12:
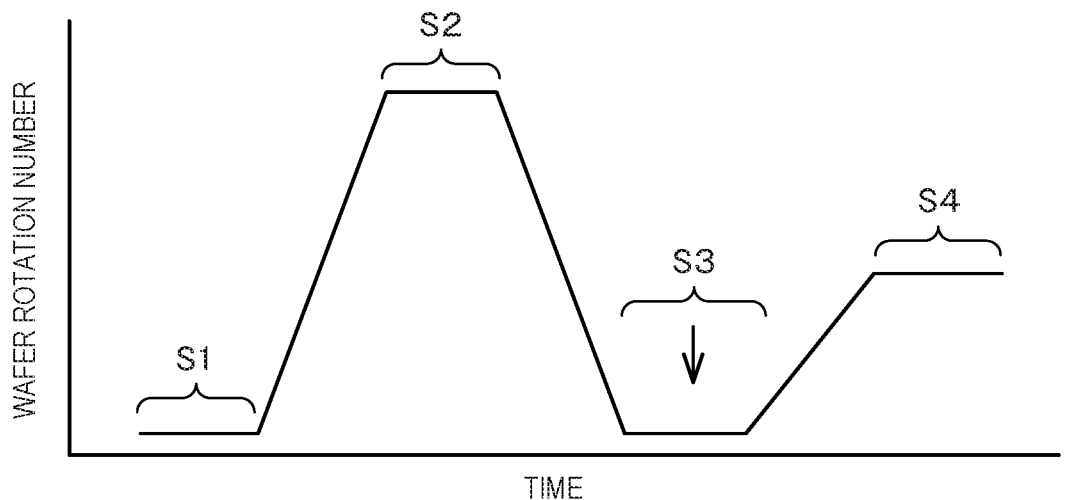
FIG. 12 A timing chart illustrating the change in rotation speed of the wafer after the supply of the resist solution until the film thickness is adjusted.

When the coating solution supply step, the coating solution diffusion step, the peripheral portion solvent supply step, and the peripheral portion film thickness adjustment step after the pre-wet treatment are regarded as Steps S1, S2, S3, S4, the change in rotation speed of the wafer W when indicated according to the time series at the above steps becomes a graph illustrated in FIG. 12. Note that in the drawing, a portion pointed with an arrow at Step S3 indicates the timing when discharging the solvent from the solvent supply nozzle 158 and discharges it at the time when the rotation speed of the wafer W becomes stable at the third rotation speed. Further, the reason why the third rotation speed is maintained for a while after the discharge is to make the solvent supplied to the peripheral portion of the wafer W blend with the solution film of the resist solution on the surface so as to preferably form a mixed layer. As a matter of course, the recipe is not limited to the above-described one, but the timing can be appropriately adjusted by the kind of the resist solution, the film thickness, the supply amount of the solvent and the like. For example, in the case of a treatment solution with a high viscosity of 500 cP or more, the solvent is not discharged to the peripheral portion of the wafer W at Step S3, but Step S4 is performed to some extent, thereafter the rotation speed is decreased again in a state where the flowability of the treatment solution remains, and the solvent is discharged to the peripheral portion of the wafer W from the solvent supply nozzle 158 to thereby adjust the film thickness at the peripheral portion. Then, the rotation speed is increased to dry the film.

After the coating treatment is performed as described above, the cleaning on the rear surface of the wafer W is performed after the resist solution is dried as in the ordinary resist coating treatment of this kind, with which a series of the coating treatment in the resist coating apparatus 32 ends. Thereafter, the wafer W is transferred to the upper anti-reflection film forming apparatus 33 in the first block G1, in which an upper anti-reflection film is formed on the wafer W. The wafer W is further transferred to the thermal treatment apparatus 40 in the second block G2 and subjected to a heat treatment. The wafer W is then transferred to the edge exposure apparatus 42 and subjected to edge exposure processing. Then, the wafer W is transferred by the wafer transfer apparatus 100 to the delivery apparatus 52, and transferred by the shuttle transfer apparatus 80 to the delivery apparatus 62 in the fourth block G4. The wafer W is then transferred by the wafer transfer apparatus 110 in the interface station 13 to the exposure apparatus 12 and subjected to exposure processing in a predetermined pattern.

After the exposure processing as in the above, the wafer W is transferred by the wafer transfer apparatus 70 to the thermal treatment apparatus 40 and subjected to a post-exposure baking treatment. This causes a deprotection reaction with an acid generated at an exposed portion of the resist film. The wafer W is thereafter transferred by the wafer transfer apparatus 70 to the developing treatment apparatus 30 and subjected to a developing treatment. After the developing treatment ends, the wafer W is transferred to the thermal treatment apparatus 40 and subjected to a post-baking treatment. The wafer W is then transferred to the thermal treatment apparatus 40 and subjected to temperature regulation. The wafer W is then transferred via the wafer transfer apparatus 70 and the wafer transfer apparatus 23 to the cassette C on a predetermined cassette mounting plate 21, and a series of photolithography process is completed.

Figure 13:
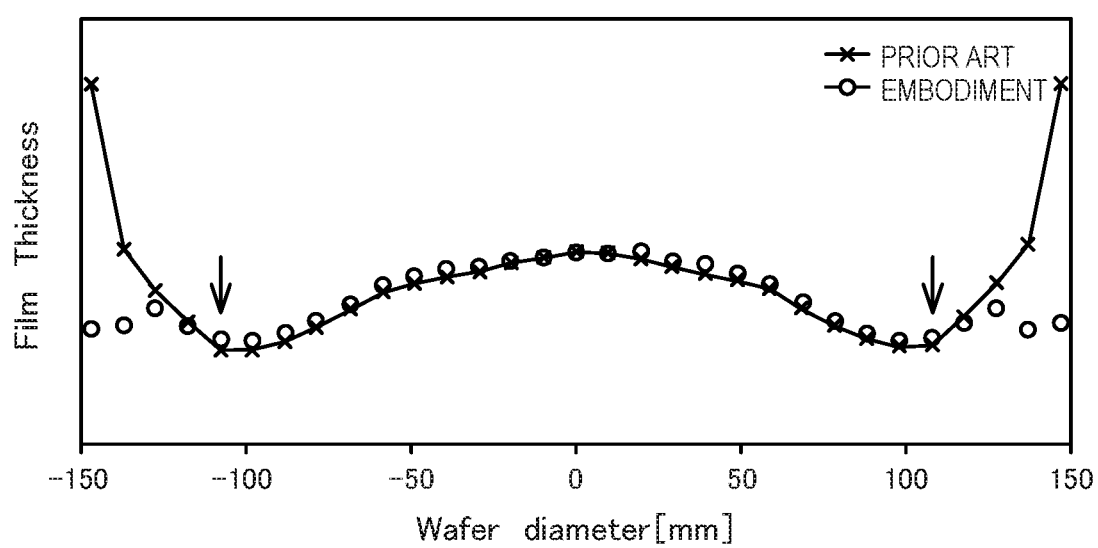
FIG. 13 A graph illustrating the comparison between profiles of the film thicknesses in the embodiment and the prior art.

The profile of the film thickness of the resist film on the wafer W subjected to the temperature regulation after the thermal treatment according to the above embodiment is illustrated in FIG. 13. In the drawing, a x mark indicates a profile of the film thickness in the prior art, namely, in the case where the pre-wet treatment was performed and then the coating with the resist solution was performed simply by the spin coating method, and a ○ mark indicates a profile of the film thickness in the case where the coating treatment was performed according to the embodiment.

As is found from the drawing, the film thickness of the resist film at the peripheral portion is greatly improved according to the embodiment. The uniformity of each film thickness when indicated by 3 sigma was 164 [sigma/nm] in the prior art, whereas it was 48 [sigma/nm] according to the embodiment.

In this example, the solvent was supplied at a point of 110 mm from the central portion of a 300 mm-wafer W (indicated with arrows in FIG. 13). This point is a portion where the film thickness starts to gradually increase under the coating treatment method in the prior art. Accordingly, as is found from the result, the peripheral portion where the solvent is discharged after the solution film of the resist solution is formed on the entire surface of the substrate in the present invention can be said to be a point where the film thickness starts to increase according to the coating treatment method in the prior art.

In the case of supplying the solvent for the resist solution to the peripheral portion of the wafer W, it is possible to further preferably perform the adjustment of the film thickness by adjusting the temperature of the solvent. In other words, increasing the temperature of the solvent to be supplied can further promote the formation of the mixed layer, thereby adjusting the profile of the film thickness in a wider range.

Figure 14:
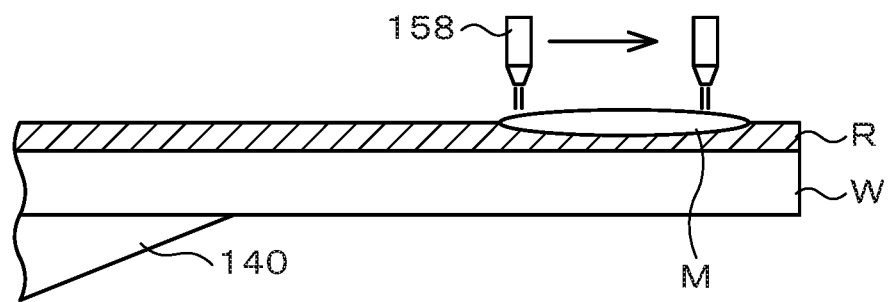
FIG. 14 A side view illustrating an appearance of moving a solvent supply nozzle in a radial direction of the wafer in supplying the solvent from a solvent supply nozzle to the peripheral portion of the wafer.

Besides, in the case where the width in the radial direction of the range for adjustment of the film thickness extends in a wide range, a mixed layer M can be spread by causing the solvent supply nozzle 158 to discharge the solvent while moving in the radial direction, for example, as illustrated in FIG. 14. In this case, the wafer W makes a plurality of rotations.

Figure 15:
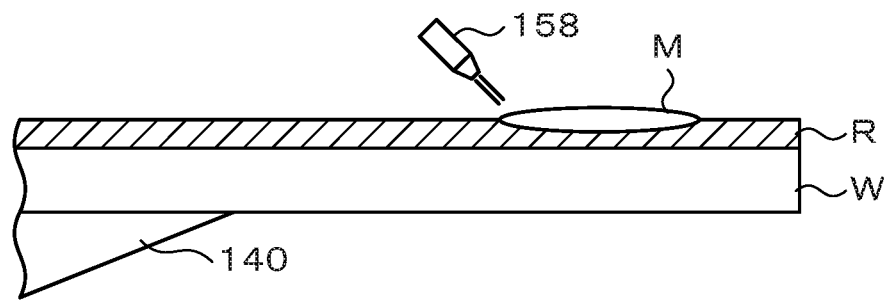
FIG. 15 A side view illustrating an appearance of supplying the solvent obliquely downward with the solvent supply nozzle inclined obliquely downward to the outer peripheral side.

Instead of moving the solvent supply nozzle 158 in the radial direction as described above, the solvent may be supplied obliquely downward to the outer peripheral side with the solvent supply nozzle 158 inclined obliquely downward to the outer peripheral side as illustrated in FIG. 15. Also by this method, the range of the formation region of the mixed layer M can be widened.

Figure 16:
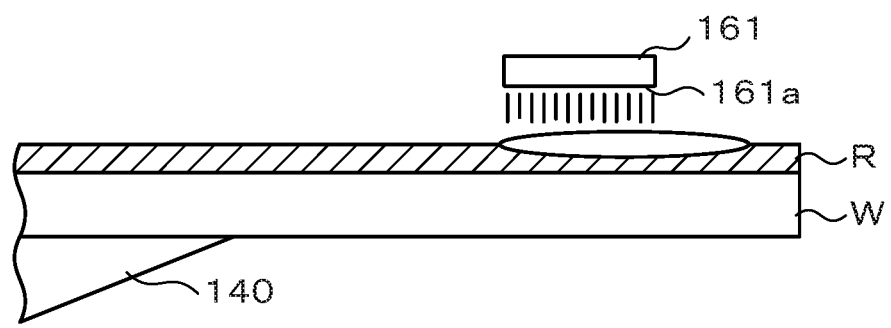
FIG. 16 A side view illustrating an appearance of supplying the solvent to the peripheral portion of the wafer using a supply nozzle formed with a plurality of supply ports in the radial direction of the wafer.

Furthermore, as illustrated in FIG. 16, a solvent supply nozzle 161 having a supply port 161a having a predetermined length in the radial direction of the wafer or having a plurality of supply ports in the radial direction of the wafer may be used as the solvent supply nozzle. The solvent supply nozzle illustrated in FIG. 16 is the one formed with a plurality of supply ports 161a in the radial direction of the wafer. As a matter of course, a solvent supply nozzle having a slit-shaped supply port may be used in place of the above.

Note that in the case of adjusting the temperature of the solvent to be supplied to the peripheral portion as described above, sharing of a nozzle which discharges the solvent at normal temperature to the central portion of the wafer W in the pre-wet treatment is accompanied by an increase of the solvent temperature, a work and time for cooling and so on, and complication of the apparatus. Further, the examples illustrated in FIG. 15 and FIG. 16 are different in configuration and structure from the nozzle which discharges the solvent to the central portion of the wafer W in the pre-wet treatment.

Figure 17:
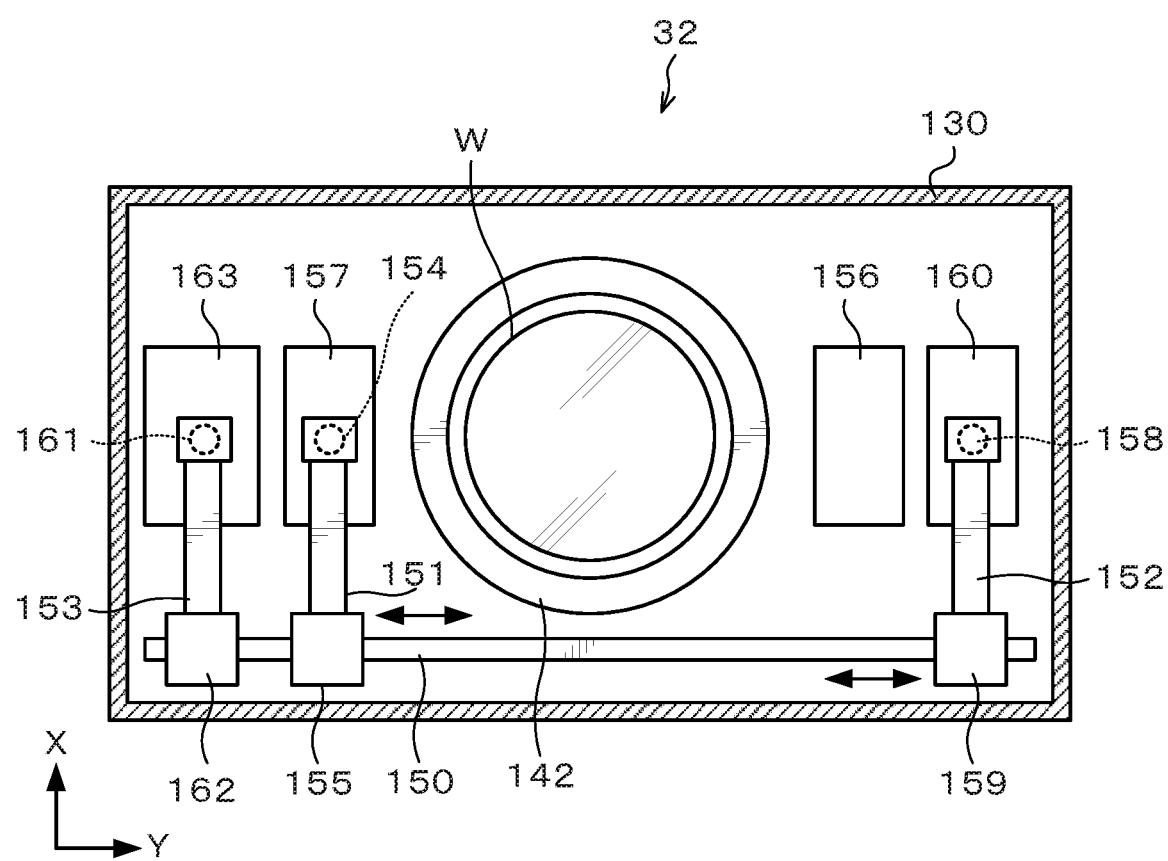
FIG. 17 A transverse sectional view illustrating the outline of the configuration of a resist treatment apparatus provided with a dedicated solvent supply nozzle for supplying the solvent to the peripheral portion of the wafer.

Accordingly, in these cases, it is only necessary that a third arm 153 is provided, for example, in the resist coating apparatus 32 and a dedicated solvent supply nozzle 161 for supplying the solvent to the peripheral portion is separately supported on the third arm 153 as illustrated in FIG. 17. More specifically, in the example in FIG. 17, the third arm 153 is movable on the rail 150 by a nozzle drive unit 162 as a third moving mechanism. Thus, the solvent supply nozzle 161 can move from a waiting section 163 provided at a Y-direction negative direction side outer position of the cup 142 to above the wafer W in the cup 142. The waiting section 163 is provided on a Y-direction negative direction side of the waiting section 157. Further, the third arm 153 can freely rise and lower by the nozzle drive unit 162 and thereby adjust the height of the solvent supply nozzle 161.

With the above configuration, in the case of supplying the temperature-regulated solvent to the peripheral portion of the wafer W using the solvent supply nozzle 161, making a nozzle configuration inclined obliquely downward to the outer peripheral side, or making a nozzle configuration having a supply port having a length in the radial direction of the wafer W, a nozzle separate from the solvent supply nozzle 158 for pre-wet treatment can be used. Note that in the case of supplying the solvent to the wafer W from the so-called dedicated solvent supply nozzle 161 for supplying the solvent to the peripheral portion, the resist solution supply nozzle 154 only needs to wait at the waiting section 156.

Preferred embodiment of the present invention have been described above referring to the drawings, but the present invention is not limited to the embodiments. It should be understood that various changes and modifications are readily apparent to those skilled in the art within the scope of the spirit as set forth in claims, and those should also be covered by the technical scope of the present invention. The present invention is not limited to the embodiment, but may take various forms. The present invention is also applicable to a case where the substrate is another substrate such as an FPD (Flat Panel Display) or a mask reticle for photomask, other than the wafer.

INDUSTRIAL APPLICABILITY

The present invention is useful in coating a top of a substrate with a coating solution.

EXPLANATION OF CODES 1 substrate treatment system
30 developing treatment apparatus
31 lower anti-reflection film forming apparatus
32 resist coating apparatus
33 upper anti-reflection film forming apparatus
40 thermal treatment apparatus
41 adhesion apparatus
42 edge exposure apparatus
140 spin chuck
154 resist solution supply nozzle
158 solvent supply nozzle
161 solvent supply nozzle
200 control unit
M mixed layer
R resist film
W wafer

What is claimed is:

1. A method for coating a top of a substrate with a coating solution, the method comprising:
   supplying, before a solution film of the coating solution formed on the substrate dries, a solvent for the coating solution to a peripheral portion on the solution film of the coating solution on the substrate while rotating the substrate at a predetermined rotation speed to form a mixed layer of the coating solution and the solvent at the peripheral portion; and
   then, controlling a film thickness of the coating solution after drying by rotating the substrate at a rotation speed higher than the predetermined rotation speed to push the mixed layer to an outer peripheral side,
   wherein at the step of supplying the solvent to the peripheral portion, the solvent is supplied only during one rotation of the substrate.

2. A method for coating a top of a substrate with a coating solution, the method comprising:
   a solvent solution film formation step of supplying a solvent for the coating solution onto the substrate to form a solution film of the solvent on an entire surface of the substrate;
   a coating solution supply step of then supplying the coating solution to a central portion of the substrate while rotating the substrate at a first rotation speed;
   a coating solution diffusion step of then diffusing the coating solution over the entire surface of the substrate by rotating the substrate at a second rotation speed higher than the first rotation speed;
   a peripheral portion solvent supply step of then supplying the solvent for the coating solution to a peripheral portion on a solution film of the coating solution on the substrate while rotating the substrate at a third rotation speed lower than the second rotation speed; and a peripheral portion film thickness adjustment step of then rotating the substrate at a fourth rotation speed higher than the third rotation speed, in sequential steps of the solvent solution film formation step, the coating solution supply step at the first rotation speed, the coating solution diffusion step at the second rotation speed, the peripheral portion solvent supply step at the third rotation speed, and the peripheral portion film thickness adjustment step at the fourth rotation speed.

3. The coating treatment method according to claim 2, wherein a viscosity of the coating solution is 20 to 500 cP.

4. The coating treatment method according to claim 2, wherein at the peripheral portion solvent supply step, the solvent is supplied only during one rotation of the substrate.

5. The coating treatment method according to claim 2, wherein at the peripheral portion solvent supply step, an amount of the solvent to be discharged is adjusted to prevent the discharged solvent from reaching a base.

6. The coating treatment method according to claim 2, wherein at the peripheral portion solvent supply step, a supply member which supplies the solvent is moved in a radial direction of the substrate.

7. The coating treatment method according to claim 2, wherein at the peripheral portion solvent supply step, a temperature of the solvent to be supplied is regulated.

8. The coating treatment method according to claim 2, wherein at the peripheral portion solvent supply step, the solvent is supplied obliquely downward to an outer peripheral side from a supply member which supplies the solvent.

9. The coating treatment method according to claim 2, wherein a supply member which supplies the solvent at the peripheral portion solvent supply step has a supply port having a predetermined length in a radial direction of the substrate or a plurality of supply ports in the radial direction of the substrate.

* * * * *